(12) United States Patent
Raja

(10) Patent No.: US 7,992,076 B2
(45) Date of Patent: Aug. 2, 2011

(54) METHOD AND DEVICE OF REWRITING A PRIMARY SECTOR OF A SECTOR ERASABLE SEMICONDUCTOR MEMORY MEANS

(75) Inventor: Jayaraman Raja, Weilimdorf (DE)

(73) Assignee: Robert Bosch GmbH, Stuttgart (DE)

( * ) Notice: Subject to any disclaimer, the term of this patent is extended or adjusted under 35 U.S.C. 154(b) by 750 days.

(21) Appl. No.: 11/885,777

(22) PCT Filed: Jan. 23, 2006

(86) PCT No.: PCT/EP2006/050364
§ 371 (c)(1),
(2), (4) Date: May 13, 2008

(87) PCT Pub. No.: WO2006/094855
PCT Pub. Date: Sep. 14, 2006

(65) Prior Publication Data
US 2009/0049368 A1    Feb. 19, 2009

(30) Foreign Application Priority Data
Mar. 8, 2005  (EP) .................................. 05101783

(51) Int. Cl.
*G06F 11/08* (2006.01)
(52) U.S. Cl. ........................ 714/807; 711/103
(58) Field of Classification Search .................. 714/807; 711/103
See application file for complete search history.

(56) References Cited

U.S. PATENT DOCUMENTS

| | | | |
|---|---|---|---|
| 5,341,330 A * | 8/1994 | Wells et al. .............. | 365/185.33 |
| 5,379,262 A * | 1/1995 | Okamoto et al. ........ | 365/230.01 |
| 5,634,050 A * | 5/1997 | Krueger et al. ......................... | 1/1 |
| 5,717,886 A * | 2/1998 | Miyauchi ...................... | 711/103 |
| 6,308,265 B1 | 10/2001 | Miller | |
| 6,426,893 B1 * | 7/2002 | Conley et al. ............ | 365/185.11 |
| 6,546,455 B1 * | 4/2003 | Hurich et al. ................. | 711/103 |
| 6,591,328 B1 * | 7/2003 | Iida et al. ...................... | 711/103 |
| 6,591,352 B2 * | 7/2003 | Lambino et al. ............. | 711/166 |
| 6,745,278 B2 * | 6/2004 | Oba .............................. | 711/103 |
| 6,754,793 B2 * | 6/2004 | Piwonka et al. ............. | 711/162 |
| 6,789,158 B2 * | 9/2004 | Takahashi ..................... | 711/103 |
| 6,823,435 B1 * | 11/2004 | Wisor .......................... | 711/170 |
| 6,938,140 B2 * | 8/2005 | Louie et al. .................. | 711/165 |
| 6,978,342 B1 * | 12/2005 | Estakhri et al. .............. | 711/103 |
| 7,086,049 B2 * | 8/2006 | Goodman ..................... | 717/168 |

FOREIGN PATENT DOCUMENTS

| | | |
|---|---|---|
| EP | 1 041 486 | 10/2000 |
| WO | WO 97/49085 | 12/1997 |

* cited by examiner

*Primary Examiner* — Stephen M Baker
(74) *Attorney, Agent, or Firm* — Kenyon & Kenyon LLP

(57) ABSTRACT

In a method of rewriting a primary sector of a sector erasable semiconductor memory device, a bootloader code is copied from the primary sector to a second sector, all content of the first sector is subsequently erased, and the bootloader code is recopied from the second to the primary sector. Subsequently, an application code is written to a remaining unused part of the primary sector.

9 Claims, 3 Drawing Sheets

Figure 1A:
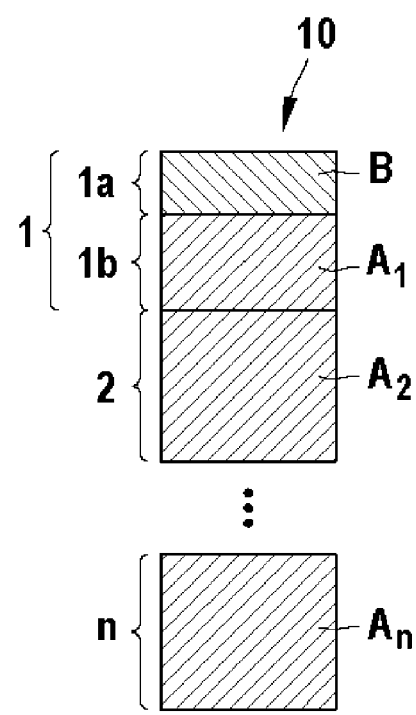

METHOD AND DEVICE OF REWRITING A PRIMARY SECTOR OF A SECTOR ERASABLE SEMICONDUCTOR MEMORY MEANS

BACKGROUND OF THE INVENTION

1. Field of the Invention

The present invention relates to a method of rewriting a primary sector of a sector erasable semiconductor memory means and a device for executing the method.

2. Description of Related Art

Controllers are using non-volatile memory devices to store basic routines and application codes which are to be executed by this controller. A small fraction of the memory space in a primary sector commonly located at address 0x00 is reserved for a bootloader code. During a start up a controller seeks for this bootloader code containing all necessary instructions to set up the hardware of the controller, for example its interfaces, such that an application code may make use of them. Corruption or loss of the bootloader renders the whole controller dysfunctional. Then it is not possible to reset the controller into a default mode or to reprogram the bootloader without use of special equipment. Thus loss or corruption of the bootloader has to be prevented any time.

Standard non-volatile semiconductor memory means needs two steps in order to rewrite data. The writing step can only set a bit to one logic level or leave it unchanged. Therefore, it necessary to apply first an erasing step setting the memory to the second logic level. The writing step can be applied to a single bit, byte or word depending on the specification of the memory device. However, the erasing step is applied to a whole sector. Thus even if only a small fraction has to be changed within one sector all its content may be affected and presumably be lost by the erasing step. Therefore, in most systems writing routines have no access to the primary sector.

The memory space needed to store the bootloader is far smaller then a sector of a conventional non-volatile memory means. The unused space could be used by an application code. As it is necessary to have the possibility to update or improve the application code and rewriting of the primary sector is not possible due to loss or corruption of the bootloader with the methods of the state of the art the unused parts of the primary sector, e.g. parts of the primary sector not used for storing the bootloader, are intentionally left free.

Currently the bootloader code does not even fill half of the primary sector of standard memory devices thus lots of memory space is wasted. Other memory devices with smaller sector sizes disadvantageously need more logic devices and longer instruction codes to address the memory space.

Another possible method writes parts of an application code to the primary sector which is assumed not to need any update in future. However, it remains almost impossible to identify these parts of an application code.

It is an object of the present invention to provide a method which enables filling parts of the primary sector with useful data or code being changeable at any time and meanwhile ensuring that a bootloader code within the primary sector remains unchanged.

A BRIEF SUMMARY OF THE INVENTION

In accordance with the present invention, prior to writing an application code to a remaining unused part of the primary sector, the bootloader code is copied from the primary sector to a second sector, all content of the first sector is erased, and the bootloader code is recopied from the second to the primary sector.

By copying and recopying the bootloader the whole first sector may be erased in order to prepare the memory means for a new writing of a new application code and keeping the bootloader code unchanged.

According to an example embodiment, first and second checksums of the bootloader code stored in the primary and second sectors are calculated and compared prior erasing the primary sector. By comparing the checksums it is possible to verify a safe copying of the bootloader. According to a further embodiment, a third checksum is calculated of the recopied bootloader code and compared to the first checksum.

According to a further example embodiment, a secondary power supply is provided before erasing the first sector, wherein the secondary power supply supplies sufficient power for processing all steps beginning with the erasing until recopying the bootloader. In case a primary power supply fails a corruption of the bootloader code may be circumvented by switching to the secondary power supply.

According to an example embodiment of the invention, the application code is a fraction of an application software wherein the fraction is chosen to fill the unused remaining part of the first sector. Thus, unused memory space may be minimised.

According to an example embodiment, the second sector is a sector of the semiconductor memory means or a secondary memory means is provided as secondary sector. In the first case, additional memory means may be saved wherein in the second case the use of a secondary memory means for intermediate storing of the bootloader may be faster and less power consuming than in the first case.

According to an example embodiment, a device for rewriting a primary sector of a non-volatile semiconductor memory means comprises a controller connected to the memory means for transmitting and receiving a bootloader code and transmitting an application code to any sector of the memory means and transmitting commands for erasing, reading and writing any sector. In a further embodiment, this device comprises a secondary power supply.

According to an example embodiment, the semiconductor memory means is a flash memory device or an EEPROM.

BRIEF DESCRIPTION OF THE VARIOUS VIEWS OF THE DRAWING

FIGS. 1*a* to 1*e* illustrate various method steps of the present invention in connection with a memory device.

Figure 2:
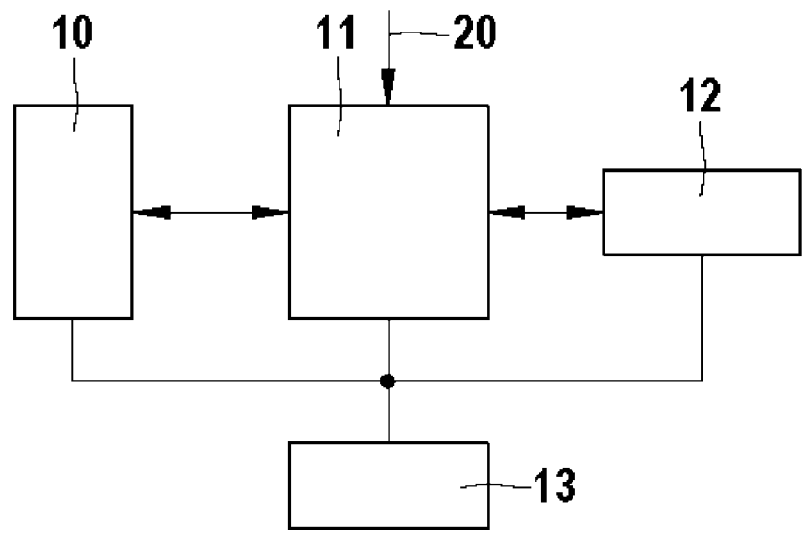

FIG. 2 illustrates a device for executing an embodiment of the inventive method.

DETAILED DESCRIPTION OF THE INVENTION

Identical reference signs in the figures designate similar or identical components or features if not mentioned otherwise.

One example embodiment of the invention will be explained with reference to the FIGS. 1*a* to 1*e*.

FIG. 1*a* schematically illustrates a non-volatile flash memory means 10. The memory means 10 is organized in sectors 1, 2, ... n which may be independently erased. Writing and reading operations to the memory device 10 may use smaller units i.e. words, bytes or bits.

A controller using this flash memory device 10 seeks for instructions stored at the address 0x00 in the primary sector 1 during a start up. These instructions further referred to as bootloader code B are needed to set up the controller for all further operations and for executing an application code $A_1$, $A_2, \ldots A_n$. The application code $A_1, A_2, \ldots A_n$ is stored in the free space of the flash memory means, e.g. in the remaining sectors 2, n and the remaining part 1b of the primary sector 1 not used by the bootloader code B.

In case the application code is desired to be improved, the parts of the application code $A_2, \ldots A_n$ stored in the sectors 2, . . . n are deleted and overwritten by the new application code. Therefore the sectors 2, n are completely erased and new code is written to these sectors.

Figure 1B:
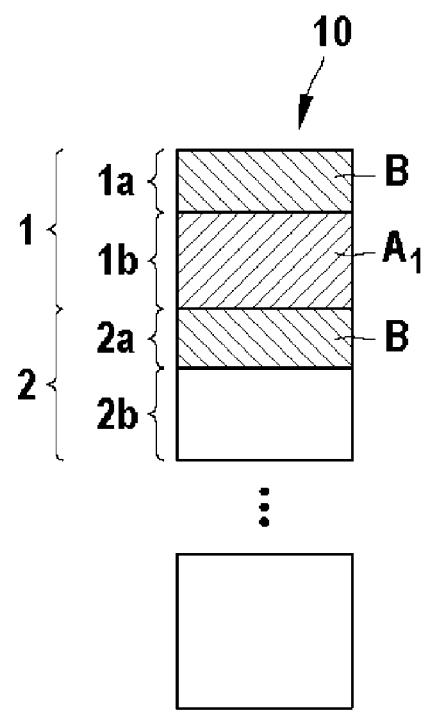
Figure 1C:
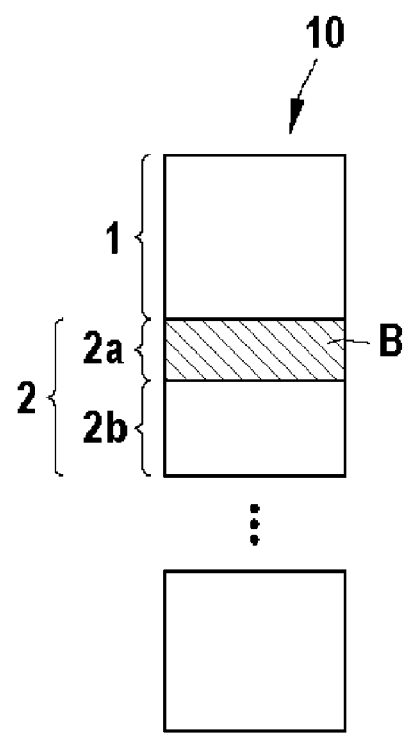
Figure 1D:
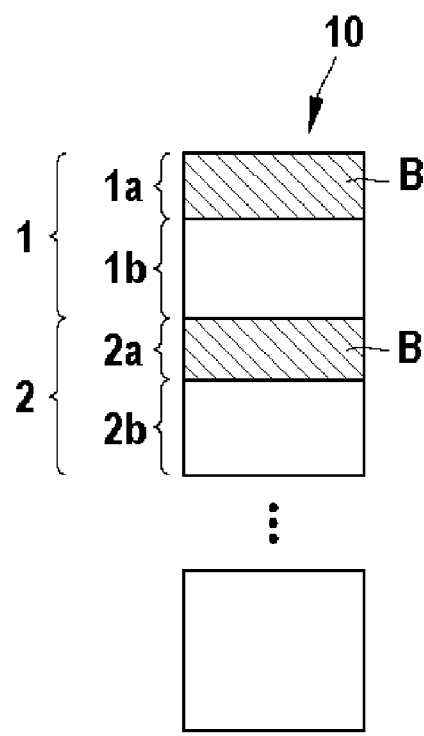
Figure 1E:
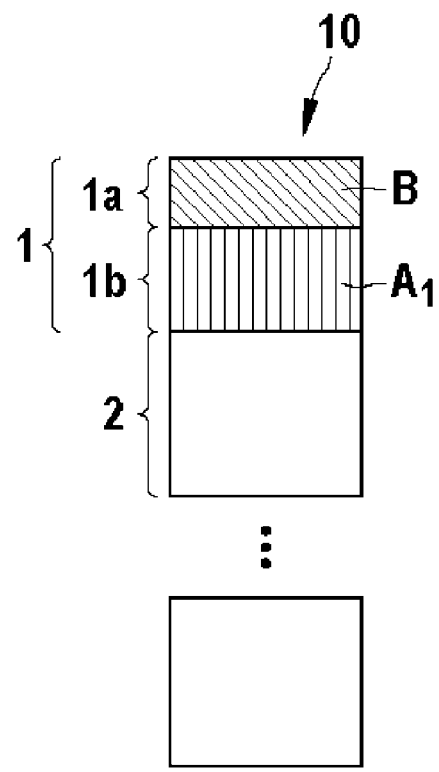

This simple method cannot be applied to the primary sector 1 as it would lead to a loss of the bootloader and by this way destroying the controller using the flash memory means 10. Therefore, in a first step one of the sectors 2, . . . n is erased and then the bootloader B is copied from the primary sector 1 to this second sector 2 (FIG. 1b). It is understood that the second sector 2 must have enough space in order to store the complete bootloader B. Afterwards, all content of the primary sector 1 is erased deleting the old application code part Al in the primary sector and the bootloader (FIG. 1c). In a subsequent step the bootloader B is copied from the second sector 2 to the primary sector 1 to the address it was stored before (FIG. 1d). Finally, the new application code $A_1^-$ may be written to a remaining part 1b of the primary sector 1 not used by the bootloader B (FIG. 1e). Additionally, the second sector may be erased and then other parts of the application code may be written to the other sectors.

As it is crucial not to change the bootloader B by this method a checksum may be calculated prior to copying the bootloader to the second sector 2. The copy of the bootloader from the primary sector 1 to the second sector may be repeated until a checksum calculated over the copied bootloader is identical to the original bootloader in the primary sector 1. These steps may be applied accordingly when the bootloader is recopied from the second sector to the primary sector.

To circumvent problems with a power failure a secondary power supply 13 may be provided as depicted in FIG. 2. The secondary power supply supplies the memory device 10 and the memory controller 11 in case a primary power supply (not illustrated) fails after the primary sector 1 has been erased and the bootloader has not been yet recopied. As the steps erasing the primary sector 1 and copying the bootloader may be finished within short time, i.e. less then two seconds, the secondary power supply may be provided as a small device, i.e. as a capacitor, on the controller itself. Advantageously the load state of the secondary power supply is checked prior to erasing the primary sector 1.

In a second embodiment a Random Access Memory Device (RAM) 12 is used for intermediate storing of the bootloader code B. Reading and writing from RAM is generally faster and less power consuming compared to the use of flash memory cells 10. By reducing the time needed for copying and recopying the bootloader especially in cases when several copies have to be made because of copying failures indicated by the checksum, a smaller secondary power supply 13 may be used and generally the probability of hazardous events during reprogramming the primary sector 1 is reduced.

The controller 11 may load a new application code from a distributor over a network system 20 or via internet.

Although the present invention has been described in connection with a method of implementing an update for an application code stored in a flash memory, the present invention is not limited thereto, but generally encompasses methods of rewriting a primary sector of a sector erasable semiconductor memory.

The invention claimed is:

1. A method for rewriting a first memory sector located in a sector-erasable semiconductor memory device, comprising:
    a) providing a bootloader code in the first memory sector located in the sector-erasable semiconductor memory device;
    b) copying the bootloader code from the first memory sector to a second memory sector;
    c) erasing all contents of the first memory sector;
    d) recopying the bootloader code from the second memory sector to the first memory sector; and
    e) writing an application code to a remaining, unused part of the first memory sector.

2. The method as recited in claim 1, further comprising, prior to step c):
    calculating a first checksum for the bootloader code stored in the first memory sector;
    calculating a second checksum for the copied bootloader code stored in the second memory sector; and
    comparing the first and second checksums.

3. The method as recited in claim 2, further comprising, after step d):
    calculating a third checksum for the recopied bootloader code stored in the first memory sector; and
    comparing the first and third checksums.

4. The method as recited in claim 2, further comprising:
    providing a secondary power supply to the sector-erasable semiconductor memory device before erasing all contents of the first sector in step c), wherein the secondary power supply supplements a primary power supply, and wherein the secondary power supply is configured to provide sufficient power for executing at least steps c) and d).

5. The method as recited in claim 2, wherein the application code is a portion of an application software, and wherein the portion is selected to fill the remaining, unused part of the first memory sector.

6. The method as recited in claim 2, wherein the sector-erasable semiconductor memory device is one of a flash memory device or an EEPROM.

7. The method as recited in claim 2, wherein the second memory sector is one of: a) located in the sector-erasable semiconductor memory device; or b) located in a secondary memory device.

8. A system for rewriting a first memory sector located in a sector-erasable semiconductor memory device, comprising:
    a controller connected to the sector-erasable semiconductor memory device, wherein the controller includes:
        means for providing a bootloader code to the first memory sector located in the sector-erasable semiconductor memory device;
        means for copying the bootloader code from the first memory sector to a second memory sector in the sector-erasable semiconductor memory device;
        means for erasing all contents of the first memory sector;
        means for recopying the bootloader code from the second memory sector to the first memory sector; and
        means for writing an application code to a remaining, unused part of the first memory sector.

9. The system as recited in claim 8, further comprising:
    a secondary power supply connected to the sector-erasable semiconductor memory device, wherein the secondary power supply supplements a primary power supply.

* * * * *